United States Patent
Gao et al.

(10) Patent No.: US 11,502,113 B2
(45) Date of Patent: Nov. 15, 2022

(54) ARRAY SUBSTRATE AND DISPLAY PANEL

(71) Applicant: Shenzhen China Star Optoelectronics Semiconductor Display Technology Co., Ltd., Guangdong (CN)

(72) Inventors: Yanan Gao, Guangdong (CN); Zhe Yu, Guangdong (CN); Ilgon Kim, Guangdong (CN)

(73) Assignee: SHENZHEN CHINA STAR OPTOELECTRONICS SEMICONDUCTOR DISPLAY TECHNOLOGY CO., LTD

( * ) Notice: Subject to any disclaimer, the term of this patent is extended or adjusted under 35 U.S.C. 154(b) by 204 days.

(21) Appl. No.: 16/770,283

(22) PCT Filed: Apr. 29, 2020

(86) PCT No.: PCT/CN2020/087660
§ 371 (c)(1),
(2) Date: Jun. 5, 2020

(87) PCT Pub. No.: WO2021/208145
PCT Pub. Date: Oct. 21, 2021

(65) Prior Publication Data
US 2022/0123022 A1 Apr. 21, 2022

(30) Foreign Application Priority Data
Apr. 15, 2020 (CN) .......................... 202010297019.2

(51) Int. Cl.
*H01L 27/12* (2006.01)
*G02F 1/1362* (2006.01)
(Continued)

(52) U.S. Cl.
CPC ...... *H01L 27/124* (2013.01); *G02F 1/136286* (2013.01); *G02F 1/13454* (2013.01); *H01L 25/18* (2013.01)

(58) Field of Classification Search
CPC ........... G02F 1/13452; G02F 1/136286; G02F 1/13454; G02F 1/1368; G02F 1/136259;
(Continued)

(56) References Cited

U.S. PATENT DOCUMENTS

2006/0022920 A1* 2/2006 Lee ...................... G09G 3/3677
345/87
2014/0176399 A1* 6/2014 Lee ...................... H01L 27/3276
345/55

(Continued)

FOREIGN PATENT DOCUMENTS

| CN | 104360558 A | 2/2015 |
| CN | 104795043 A | 7/2015 |

(Continued)

*Primary Examiner* — Mouloucoulaye Inoussa
(74) *Attorney, Agent, or Firm* — Luedeka Neely Group, PC

(57) ABSTRACT

An array substrate and a display panel are disclosed. The array substrate includes a base substrate, a driver circuit, and a first chip-on-film structure. The array substrate further includes a plurality of transition modules and a plurality of array lines. A gate driver on array (GOA) circuit is separate from the driver circuit to be independently electrically connected to the transition modules and is connected to the base substrate through the array lines, so that problems of occurrence of corner regions in the array lines and heat likely to be produced in the corner regions can be avoided, and display quality of the display panel can be improved.

9 Claims, 2 Drawing Sheets

(51) Int. Cl.
*G02F 1/1345* (2006.01)
*H01L 25/18* (2006.01)

(58) Field of Classification Search
CPC .............. G02F 1/1309; G02F 1/1362; G02F
1/134372; G02F 1/136254; G02F 1/1343;
G02F 1/13338; G02F 1/134336; H01L
25/18; H01L 24/05; H01L 24/08; H01L
27/124; H01L 24/06; H01L 23/544; H01L
23/585; H01L 51/0097; H01L 27/1464;
H01L 27/3244; H01L 27/3276; G09G
3/3233; G09G 3/3275; G09G 3/3291;
G09G 3/006; G09G 3/3677; G01R
31/2825; G01R 31/2884; G06F 3/0443;
G06F 3/0412; G06F 3/04164; G06F
11/2221; G06F 3/0446; G06F 3/041662;
H05K 1/0274; G06V 40/1306; Y02E
10/549; Y02P 70/50; Y02D 30/50
USPC ..... 345/174, 92; 324/760.02, 760.01, 750.3;
349/42, 149
See application file for complete search history.

(56) References Cited

U.S. PATENT DOCUMENTS

| | | | |
|---|---|---|---|
| 2015/0161928 A1* | 6/2015 | Kim | G09G 3/3666 |
| | | | 345/1.3 |
| 2016/0210918 A1* | 7/2016 | Kim | G09G 3/3677 |
| 2018/0040672 A1* | 2/2018 | Park | H01L 27/3276 |
| 2018/0074361 A1* | 3/2018 | Chung | H05K 5/02 |
| 2018/0366529 A1* | 12/2018 | Lee | H01L 27/3276 |
| 2019/0027096 A1* | 1/2019 | Kim | H01L 27/124 |
| 2019/0041711 A1* | 2/2019 | Fujikawa | G02F 1/13452 |
| 2019/0129549 A1* | 5/2019 | Yeh | G02F 1/1368 |
| 2019/0195940 A1 | 6/2019 | Chen | |
| 2020/0006387 A1* | 1/2020 | Moon | H01L 27/124 |
| 2020/0211493 A1* | 7/2020 | Kim | G09G 3/3677 |
| 2020/0243039 A1 | 7/2020 | Han et al. | |

FOREIGN PATENT DOCUMENTS

| | | |
|---|---|---|
| CN | 110109301 A | 8/2019 |
| CN | 110320698 A | 10/2019 |
| CN | 109345961 B | 11/2020 |
| KR | 20090102215 A | 9/2009 |

* cited by examiner

ARRAY SUBSTRATE AND DISPLAY PANEL

FIELD OF INVENTION

The present invention relates to a technical field of displays, and particularly to, an array substrate and a display panel.

BACKGROUND

With development of display technology, flat display devices, such as liquid crystal display (LCD) devices and organic light-emitting diode (OLED) devices are widely used due to advantages of high display quality, power-saving, and being compact.

In designing internal circuit structures of current display panels, gate driver circuits and data circuits are generally configured on a same printed circuit board. The printed circuit board and a chip-on-film (COF) for transmitting gate driver signals are connected through wire on array (WOA) on a substrate. During connection, the COF is connected to a set of fanout wires on the substrate and is further connected to other gate lines through the fanout wires. But, with development of narrow bezel and high-resolution display panels, the load on WOA is relatively large when signal transmission is in progress, so that when the current is concentrated to pass a WOA having a thinner line width, a corner of the WOA is likely to become hot, which affects charging in display panels as well as display effects and service life of display panels.

Therefore, it is imperative to provide a solution to overcome the problem in the prior art.

As mentioned above, a technical problem is that in conventional narrow bezel and high-resolution display panels, the load on WOA is relatively large when signal transmission is in progress, so that corners of lead lines are likely to become hot, thereby affecting charging of thin-film transistors in display panels as well as adversely influencing display effects and service life of display panels.

SUMMARY OF INVENTION

An object of the present disclosure is to provide an array substrate and a display panel to overcome problems, such as corner regions formed by array lines on array substrates of conventional narrow bezel and high-resolution display panels, and heat likely to be produced in the corner regions because of an overload of current flow.

In order to achieve the above-mentioned object, an embodiment of the present disclosure provides a technical solution as follows:

According to a first aspect of an embodiment of the present invention, the present disclosure provides an array substrate provided with a display area and a non-display area around the display area, comprising a base substrate; a driver circuit disposed on the base substrate in the non-display area; a plurality of first chip-on-film structures, wherein the driver circuit is connected to the base substrate through the first chip-on-film structures; and a plurality of transition modules and a plurality of array lines, wherein one end of the transition modules is electrically connected to the driver circuit, and the other end of the transition modules is electrically connected to the base substrate through the array lines; wherein the transition modules and the array lines are disposed in a peripheral region of the base substrate in the non-display area, the array lines are located in parallel with the peripheral region of the base substrate, and each of the array lines is connected to a corresponding one of gate lines provided on the base substrate.

According to one embodiment of the present disclosure, the driver circuit comprises a gate driver on array (GOA) circuit, and the GOA circuit is electrically coupled to the transition modules and is configured to provide GOA circuit signals to the base substrate through the array lines.

According to one embodiment of the present disclosure, the transition module comprises a plurality of second chip-on-film structures.

According to one embodiment of the present disclosure, the second chip-on-film structures and the first chip-on-film structures are disposed side by side and spaced apart from each other, and the second chip-on-film structures are provided on at least a side of the first chip-on-film structures.

According to one embodiment of the present disclosure, the GOA circuit comprises a clock signal circuit, a start signal circuit, and a low potential signal circuit.

According to one embodiment of the present disclosure, the first chip-on-film structures are parallelly spaced apart from each other in the peripheral region of the base substrate.

According to one embodiment of the present disclosure, the base substrate comprises a plurality of pixel areas arranged in an array and a plurality of thin-film transistors provided corresponding to the pixel areas.

According to a second aspect of an embodiment of the present invention, the present disclosure provides an array substrate provided with a display area and a non-display area around the display area, comprising a base substrate; a driver circuit disposed on the base substrate in the non-display area; a plurality of first chip-on-film structures, wherein the driver circuit is connected to the base substrate through the first chip-on-film structures; and a plurality of transition modules and a plurality of array lines, wherein one end of the transition modules is electrically connected to the driver circuit, and the other end of the transition modules is electrically connected to the base substrate through the array lines.

According to one embodiment of the present disclosure, the driver circuit comprises a gate driver on array (GOA) circuit, and the GOA circuit is electrically coupled to the transition modules and is configured to provide GOA circuit signals to the base substrate through the array lines.

According to one embodiment of the present disclosure, the transition modules comprise a plurality of second chip-on-film structures.

According to one embodiment of the present disclosure, the second chip-on-film structures and the first chip-on-film structures are disposed side by side and spaced apart from each other, and the second chip-on-film structures are provided on at least a side of the first chip-on-film structures.

According to one embodiment of the present disclosure, the GOA circuit comprises a clock signal circuit, a start signal circuit, and a low potential signal circuit.

According to one embodiment of the present disclosure, the first chip-on-film structures are parallelly spaced apart from each other in a peripheral region of the base substrate.

According to one embodiment of the present disclosure, the transition modules and the array lines are disposed in a peripheral region of the base substrate in the non-display area, and the array lines are in parallel with the peripheral region of the base substrate.

According to one embodiment of the present disclosure, each of the array lines is connected to a corresponding one of gate lines provided on the base substrate.

According to one embodiment of the present disclosure, the base substrate comprises a plurality of pixel areas arranged in an array and a plurality of thin-film transistors provided corresponding to the pixel areas.

According to a third aspect of an embodiment of the present invention, the present disclosure provides a display panel comprising an array substrate provided with a display area and a non-display area around the display area, comprising a base substrate; a driver circuit disposed on the base substrate in the non-display area; a plurality of first chip-on-film structures, wherein the driver circuit is connected to the base substrate through the first chip-on-film structures; and a plurality of transition modules and a plurality of array lines, wherein one end of the transition modules is electrically connected to the driver circuit, and the other end of the transition modules is electrically connected to the base substrate through the array lines.

According to one embodiment of the present disclosure, the driver circuit comprises a gate driver on array (GOA) circuit, and the GOA circuit is electrically coupled to the transition modules and is configured to provide GOA circuit signals to the base substrate through the array lines.

According to one embodiment of the present disclosure, the transition modules comprise a plurality of second chip-on-film structures.

According to one embodiment of the present disclosure, the second chip-on-film structures and the first chip-on-film structures are disposed side by side and spaced apart from each other, and the second chip-on-film structures are provided on at least a side of the first chip-on-film structures.

The embodiment of the present disclosure has advantageous effects as follows: based on an array substrate and a display panel provided by the embodiment of the present disclosure, a plurality of transition modules are disposed on a base substrate in a non-display area, a GOA circuit is separate from a driver circuit to be connected to the transition modules, and the transition modules are further connected to the base substrate through array lines. By a structure provided in the disclosed embodiment, a corner region produced by the array lines on the base substrate can be improved, so that a problem of heating up of the array lines in the corner region due to an overload is effectively prevented, thereby improving display quality of the display panel and extending service life.

DESCRIPTION OF PREFERRED EMBODIMENTS

The following embodiments are referring to the accompanying drawings for exemplifying specific implementable embodiments of the present invention.

Figure 1:
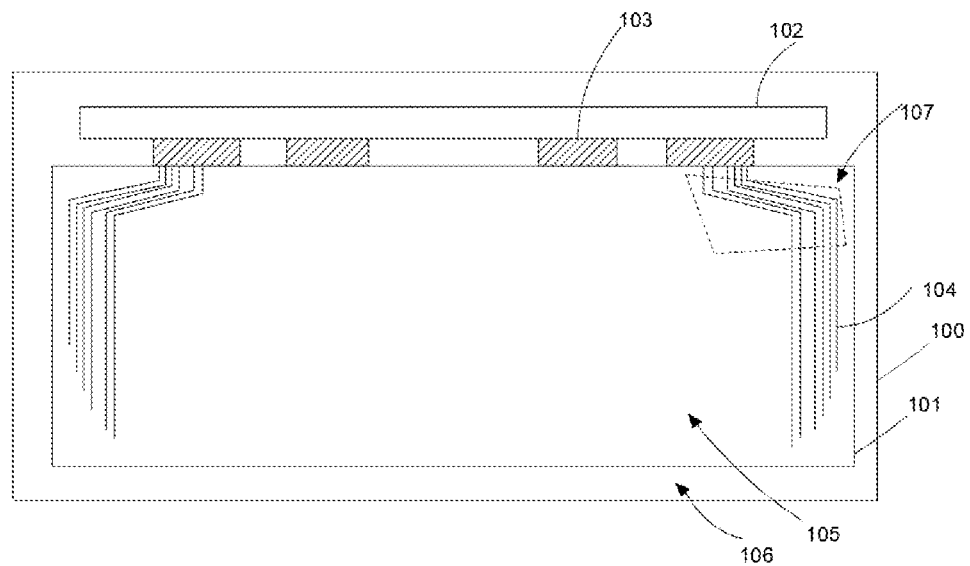
FIG. 1 is a schematic structural view of a display panel in the prior art.

As shown in FIG. 1, FIG. 1 is a schematic structural view of a display panel in prior art. The display panel 100 includes a display area 105 and a non-display area 106, and the non-display area 106 is disposed around the display area 105. In addition, the display panel 100 further includes a liquid crystal display (LCD) substrate 101 and a driver circuit 102. A light-emitting area of the display panel is defined on the LCD substrate 101 corresponding to position of the display area 105.

The driver circuit 102 is electrically connected to the LCD substrate 101 through a plurality of chip-on-film structures 103. The driver circuit 102 includes a plurality of driver signal lines for providing data signals and control signals to the LCD substrate 101. Further, each of the chip-on-film substrates 103 is connected to a corresponding one of gate lines of the LCD substrate 101 through a wire on array (WOA) 104. Since the LCD substrate 101 includes a plurality of rows of gate lines, a corner region 107 occurs on the LCD substrate when the WOA 104 is connected to the gate lines. As signals are transmitted from the WOA to the display panel, a relatively large load of signal output occurs in the corner region 107, and the relatively large load causes a large amount of heat when current passes the corner region, which adversely affects a normal display of the display panel.

In order to overcome the heat in the corner region of the WOA of the display panel, improve display quality of the display panel, and achieve narrow bezel design, the present disclosure provides a display panel.

Figure 2:
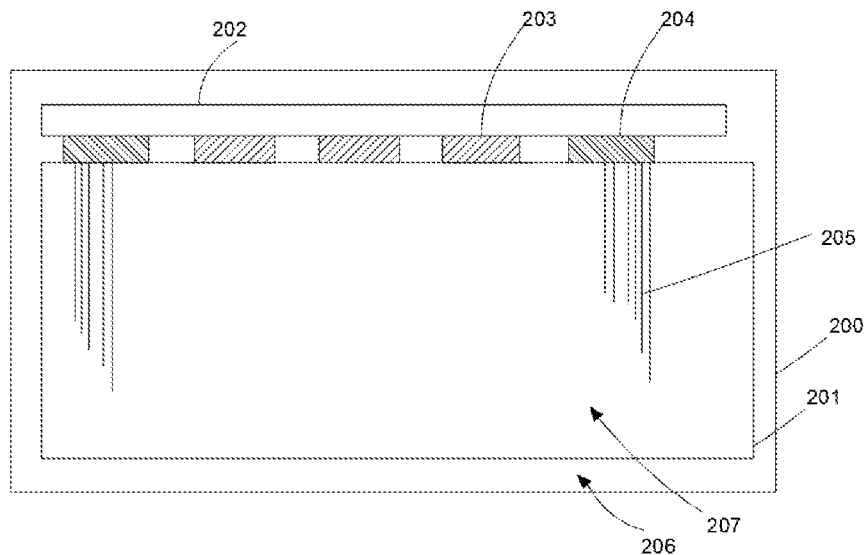
FIG. 2 is a schematic structural view of a display panel provided by an embodiment of the present disclosure.

As shown in FIG. 2, a schematic structural view of a display panel provided by an embodiment of the present disclosure is illustrated. A display panel 200 includes a base substrate 201 and a driver circuit 202. Further, the display panel 200 is provided with a display area 207 and a non-display area 206. The non-display area 206 is disposed around the display area 207. That is, in this embodiment, the non-display area 206 is disposed on peripheries of the display area 207.

In addition, the display panel 200 further includes a plurality of first chip-on-film structures 203, a plurality of transition modules 204, and a plurality of array lines 205. The first chip-on-film structures 203 and the transition modules 204 are disposed in the non-display area 206. Furthermore, one end of the first chip-on-film structures 203 is electrically connected to the driver circuit 202, and the other end is electrically connected to the base substrate 201, so that transmission of data signals is achieved.

One end of the transition modules 204 is electrically connected to the driver circuit 202, and the other end is electrically connected to the base substrate 201 through the array lines 205.

Specifically, in a disclosed embodiment, the first chip-on-film structures 203 may be disposed side by side and spaced apart from each other. A spacing between any adjacent two of the first chip-on-film structures 203 may be the same, and a width of each of the first chip-on-film structures 203 is the same.

The transition modules 204 may be arranged on the same row as the first chip-on-film structures 203, and the transition modules 204 are provided on at least a side of the first chip-on-film structures 203. In a disclosed embodiment, peripheral regions of two sides of the first chip-on-film structures 203 are provided with the transition modules 204. The transition modules 204 are connected to gate lines of thin-film transistors provided in the display area 207 through the array lines 205 to enable signal input.

In an embodiment of the present disclosure, the driver circuit 202 includes a plurality of data signal lines and control signal lines. Specifically, the driver circuit 202 includes a gate driver on array (GOA) circuit.

Further, in order to improve the above-mentioned corner region of the array lines 205 of the display panel 200, the GOA circuit is separate from the driver circuit 202, then the GOA circuit is electrically connected to the transition modules 204 in the disclosed embodiment, and the transition modules 204 are connected to the base substrate 201 through the array lines 205.

In an embodiment of the present disclosure, the GOA circuit may include a clock signal circuit, a start signal circuit, and a low potential signal circuit. The above-mentioned signal circuits are each electrically connected to the transition modules 204, so that the transition modules 204 are enabled to transmit signals for the signal circuits.

Since the transition modules 204 are disposed in the peripheral regions of the display area 207, the transition modules 204 are still located adjacent to a border of the display panel 200 when the transition modules 204 and the array lines 205 are connected. In this manner, the array lines 205 can extend straight from the transition modules 204 without forming the corner regions in the display panel 200, thereby reducing a dense arrangement of the array lines 205.

When data signals are transmitted by the array lines 205, the array lines 205 are prevented from heating up by a dense arrangement of the array lines, thereby effectively improving layouts of internal circuit lines of the display panel 200 as well as reliability of the display panel. In a disclosed embodiment, the array lines 205 are disposed in the peripheral regions of the display area 207, which is much more beneficial to a design for narrow bezel display panels and improvement of comprehensive performance of display panels.

Further, in configuration, the array lines 205 may be arranged in parallel with a border of the base substrate 201, so that a wiring process can be simplified and production efficiency can be improved. In addition, a plurality of pixel areas arranged in an array are disposed on the base substrate 201 in the display area 207, and a plurality of thin-film transistors are provided corresponding to the pixel areas. Each of the array lines 205 is connected to a corresponding one of gate lines of the thin-film transistors for providing driver signals, thereby realizing normal lighting of the display panel.

In an embodiment of the present disclosure, the transition modules 204 may include a plurality of second chip-on-film structures. In configuring, the second chip-on-film structures are spaced apart from the first chip-on-film structures 203 at an equal spacing, and are disposed on the same row as that of the first chip-on-film structures. In addition, the second chip-on-film structures are provided on at least a side of the first chip-on-film structures 203.

Preferably, the transition modules 204 may further be disposed on two sides of the base substrate 201 and located adjacent to peripheral regions of the two sides of the base substrate 201. In addition, the GOA circuit is separate from the driver circuit 202 and is electrically connected to the transition modules 204, and then make the array lines 205 connect to the transition modules 204 such that the array lines 205 are disposed on the display panel 200 in a straight arrangement, thereby preventing a corner region from being formed by multiple bends of the array lines 205.

Preferably, in disposing the second chip-on-film structures, two sides of the first chip-on-film structures 203 may be provided with the second chip-on-film structures, respectively. That is, there are two second chip-on-film structures to meet an internal wiring requirement of the display panel, and to solve a problem arising from multiple times of bending of the array lines 205 and charging of thin-film transistors.

Figure 3:
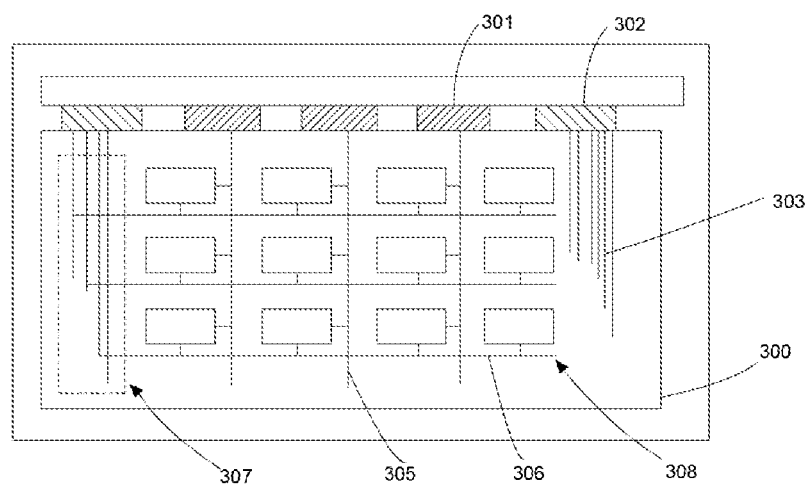
FIG. 3 is another schematic structural view of a display panel provided by an embodiment of the present disclosure.

As shown in FIG. 3, FIG. 3 is another schematic structural view of a display panel provided by an embodiment of the present disclosure. A plurality of pixel areas arranged in an array, a plurality of data lines 305 and gate scan lines 306 are disposed on the base substrate in the display area 308. The data lines 305 and the gate scan lines 306 are arranged in an array in rows or in columns.

In an embodiment of the present disclosure, the display panel further includes a plurality of first chip-on-film structures 301 and a plurality of second chip-on-film structures 302 disposed on two sides of the first chip-on-film structures 301. The second chip-on-film structures 302 are electrically connected to the GOA circuit in the driver circuit and are correspondingly connected to the gate scan lines 306 of the display panel through a plurality of array lines 303. By disposing the second chip-on-film structures 302 arranged in alignment with a GOA circuit area 307 in a vertical direction, an entire width of the array lines 303 in the GOA circuit area 307 is the same as an entire width of data bus lines of the display panel. In this manner, the array lines 303 can be straightforwardly connected to lines in the GOA circuit area 307, so that an occurrence of multiple bends of the array lines is prevented, thereby effectively overcoming a problem of heating up of the array lines in the corner region due to a dense arrangement, and improving reliability of the display panel.

In addition, an embodiment of the present disclosure further provides a display device. The display device includes the array substrate and the display panel disclosed in the embodiments of the present disclosure. The array lines are arranged in the display device in a specific configuration, which is beneficial to a design for narrow bezel display panels, thereby improving reliability of the display device as well as service life.

The above describes the array substrate and the display panel provided by the embodiments of the present disclosure in detail. The descriptions of the above embodiments are only used to help understand the technical solutions and kernel ideas of the present disclosure; those of ordinary skill in the art should understand that they can still modify the technical solutions described in the foregoing embodiments, whereas these modifications or substitutions do not deviate the essence of the corresponding technical solutions from the scope of the technical solutions of the embodiments of the present disclosure.

What is claimed is:

1. An array substrate provided with a display area and a non-display area around the display area, comprising:
   a substrate;
   a driver circuit disposed on the base substrate in the non-display area and comprising a gate driver on array (GOA) circuit;
   a plurality of first chip-on-film structures, wherein the driver circuit is connected to the base substrate through the first chip-on-film structures; and
   a plurality of transition modules and a plurality of array lines, wherein one end of the transition modules is electrically connected to the driver circuit, and the other end of the transition modules is electrically connected to the base substrate through the array lines;
   wherein the transition modules and the array lines are disposed in a peripheral region of the base substrate in the non-display area, the array lines are located in parallel with the peripheral region of the base substrate and extend straight from the transition modules, each of the array lines is connected to a corresponding one of gate lines provided on the base substrate, and the GOA circuit is electrically coupled to the transition modules and is configured to provide GOA circuit signals to the base substrate through the array lines.

2. The array substrate of claim 1, wherein the transition modules comprise a plurality of second chip-on-film structures.

3. The array substrate of claim 2, wherein the second chip-on-film structures and the first chip-on-film structures are disposed side by side and spaced apart from each other, and the second chip-on-film structures are provided on at least a side of the first chip-on-film structures.

4. The array substrate of claim 1, wherein the GOA circuit comprises a clock signal circuit, a start signal circuit, and a low potential signal circuit.

5. The array substrate of claim 1, wherein the first chip-on-film structures are parallelly spaced apart from each other in the peripheral region of the base substrate.

6. The array substrate of claim 1, wherein the base substrate comprises a plurality of pixel areas arranged in an array and a plurality of thin-film transistors provided corresponding to the pixel areas.

7. A display panel comprising an array substrate provided with a display area and a non-display area around the display area, comprising:
　a base substrate;
　a driver circuit disposed on the base substrate in the non-display area and comprising a gate driver on array (GOA) circuit;
　a plurality of first chip-on-film structures, wherein the driver circuit is connected to the base substrate through the first chip-on-film structures; and
　a plurality of transition modules and a plurality of array lines, wherein one end of the transition modules is electrically connected to the driver circuit, and the other end of the transition modules is electrically connected to the base substrate through the array lines;
　wherein the transition modules and the array lines are disposed in a peripheral region of the base substrate in the non-display area, the array lines are located in parallel with the peripheral region of the base substrate and extend straight from the transition modules, each of the array lines is connected to a corresponding one of gate lines provided on the base substrate, and the GOA circuit is electrically coupled to the transition modules and is configured to provide GOA circuit signals to the base substrate through the array lines.

8. The display panel of claim 7, wherein the transition modules comprise a plurality of second chip-on-film structures.

9. The display panel of claim 8, wherein the second chip-on-film structures and the first chip-on-film structures are disposed side by side and spaced apart from each other, and the second chip-on-film structures are provided on at least a side of the first chip-on-film structures.

* * * * *